(12) United States Patent
Miller (10) Patent No.: US 7,787,507 B2
(45) Date of Patent: Aug. 31, 2010

(54) METHOD AND APPARATUS FOR CONTROLLING LASER MODULATION BASED ON MEASUREMENTS OF AVERAGE LASER OUTPUT POWER

(75) Inventor: Frederick W. Miller, Santa Clara, CA (US)

(73) Assignee: Avago Technologies Fiber IP (Singapore) Pte., Ltd. (SG)

( * ) Notice: Subject to any disclaimer, the term of this patent is extended or adjusted under 35 U.S.C. 154(b) by 155 days.

(21) Appl. No.: 11/621,590

(22) Filed: Jan. 10, 2007

(65) Prior Publication Data
US 2008/0165813 A1   Jul. 10, 2008

(51) Int. Cl.
*H01S 3/00* (2006.01)
(52) U.S. Cl. .............. 372/38.01; 372/38.02; 372/38.07; 372/38.09
(58) Field of Classification Search ................. None
See application file for complete search history.

(56) References Cited

U.S. PATENT DOCUMENTS 4,592,057 A * 5/1986 Comerford ............... 372/38.02
4,612,671 A * 9/1986 Giles ........................ 372/38.02
6,414,974 B1 * 7/2002 Russell et al. ............ 372/38.02

* cited by examiner

*Primary Examiner*—Minsun Harvey
*Assistant Examiner*—Sean Hagan (57) ABSTRACT

Laser modulation is controlled by using a measurement of the average output power level of the laser to adjust the amplitude of the modulation current as necessary to prevent the laser from being over- or under-modulated and to adjust the amplitude of the bias current as necessary to maintain the average output power level of the laser at a desired, reasonably constant level. The laser controller receives an electrical feedback signal from a laser output power monitoring device and uses this signal to obtain the measurement of the average output power level of the laser. Based on this measurement, a bias current control signal and a modulation current control signal are generated and output to the laser driver to cause the laser driver to set the amplitude of the bias current to achieve a desired average output power level and to set the amplitude of the modulation current to prevent over- and under-modulation.

17 Claims, 6 Drawing Sheets

METHOD AND APPARATUS FOR CONTROLLING LASER MODULATION BASED ON MEASUREMENTS OF AVERAGE LASER OUTPUT POWER

TECHNICAL FIELD OF THE INVENTION

The invention relates to lasers. More particularly, the invention relates to controlling laser modulation based on measurements of average laser output power to control laser modulation while also maintaining the average output power of the laser at a desired level.

BACKGROUND OF THE INVENTION

Lasers are used in many different industries for many different purposes, such as, for example, in the medical industry for medical procedures, in the printing industry in laser printers, in the defense industry in a variety of defense applications, and in the optical communications industry for transmitting and receiving optical signals. In many applications, the output power of the laser is monitored and controlled to maintain the output power at a desired or required level. Due to the wide variations in laser parameters such as, for example, laser slope efficiency (SE) and laser threshold current ($I_{TH}$), maintaining the optical power at a particular level is challenging because temperature and process variations and aging of system components also cause the output power level to vary. Many techniques and systems have been used or proposed to control and maintain the output power of the laser at required levels over temperature and process variations and time.

It is common practice in the optical communications industry to use a monitor photodiode to detect light output from a rear portion of the transmitter laser (or a portion of the output power reflected back through optical lenses) and to use this optical feedback to measure and control the average transmitted output power level of laser. In general, the average transmitted output power level, $P_{AVG}$, of the laser can be controlled by controlling the bias current, $I_{BIAS}$, of the laser. Thus, if the optical feedback indicates that $P_{AVG}$ has fallen below the required level, increasing $I_{BIAS}$ by an appropriate amount will raise $P_{AVG}$ to the required level. Similarly, if the optical feedback indicates that $P_{AVG}$ has risen above the required level, decreasing $I_{BIAS}$ by an appropriate amount will lower $P_{AVG}$ to the required level.

As the optical feedback path described above is used to maintain $P_{AVG}$ at the required level, the laser is modulated with a modulation current, IMOD, to cause the laser output power level to be adjusted between a level, P1, that represents a logic 1, and a power level, P0, that represents a logic 0. The amplitude of the modulation current $I_{MOD1}$ corresponds to an output power level of P1. The amplitude of the modulation current $I_{MOD0}$ corresponds to an output power level of P0. The laser threshold current $I_{TH}$ has an amplitude that is sufficient to cause the laser to begin producing laser action (i.e., to emit stimulated radiation). The amplitude of the threshold current $I_{TH}$ needed to produce laser action varies due to factors such as, for example, temperature and aging. Due to these variations in the amplitude of $I_{TH}$ that is needed to produce lasing and the slope efficiency of the laser, adjustments must be made to the amplitudes corresponding to $I_{MOD1}$ and $I_{MOD0}$ in order to maintain P0 and P1 at the necessary respective output power levels.

A variety of techniques have been used to control the amplitude of the modulation current. One known technique sets the amplitude of the modulation current at a level that achieves a desired extinction ratio (ER) or optical modulation amplitude (OMA) at a fixed temperature or time. The amplitude of the modulation current is then increased or decreased based on an analog temperature coefficient, or in a digital control system, based on a temperature measurement and/or and aging timer. This technique generally provides suitable results if the laser SE variation is controlled well enough to maintain the ER/OMA and the laser performance within specifications. A disadvantage of this technique is that using a single temperature reference point means the adjustment to the amplitude of the modulation current is essentially based on a "guess" of changes of the SE in direction and amount based on statistical or other data. Because the change in the SE often is not linear and can change from positive to negative slope from one temperature to the next, it is difficult or impossible to determine the optimal adjustment in the amplitude of the modulation current. In addition, this technique can also limit laser yields because the SE and $I_{TH}$ limits need to be within sufficiently tight tolerances to guarantee that a suitable level of performance will be achieved without the necessity of testing each laser over temperature and customizing each laser based on the results of testing.

Another known technique involves measuring the amplitudes of the modulation current needed to maintain the required output power levels $P_{AVG}$, P0 and P1 over a range of temperatures on a part-by-part or wafer-by-wafer basis. The amplitude values obtained during testing are programmed into a lookup table (LUT) memory element or other non-volatile memory element. A controller uses a temperature measurement value to index into the memory element and read out the corresponding amplitude value for the modulation current. The amplitude of the modulation current of the laser is then set to the value read out of the memory element. One disadvantage of this technique is that it requires over-temperature testing during manufacturing, which is expensive. In addition, it is difficult to factor in aging when using this technique, which means that the amplitude of the modulation current often will not be set to an optimal level.

Another technique that has been proposed involves using a high-speed monitor diode in combination with an amplitude detector to monitor the output power level of the laser and adjust the amplitude of the modulation current to achieve the required output power level. This technique requires an additional high-bandwidth feedback path for the amplitude detector, which increases the cost and complexity of the transmitter. In addition, the performance of the amplitude detector can be significantly affected by temperature variations, which can lead to less than optimal performance. Also, the amplitude detector dissipates a large amount of power relative to the rest of the transmitter. Because of these difficulties, this technique has been proposed, but not actually implemented.

Another known technique involves measuring $I_{TH}$ in situ by adjusting the modulation current amplitude while measuring the optical feedback signal to obtain the slope and calculate the corresponding SE. The measured $I_{TH}$ and SE are then used to calculate the amount of modulation current needed. An advantage of this technique is that the existing feedback path for the monitor photodiode is used. A disadvantage of this technique is that it requires a large amount of signal processing to be performed to make the necessary calculations, and is therefore computationally intensive. Another disadvantage is that the method is performed during module power up or module programming, and generally cannot be used while transmitting actual data.

A similar technique also uses the existing feedback path to calculate SE, but also modulates a very small amplitude signal at low frequency on top of the IBIAS supplied to the laser.

This signal is then extracted from the feedback signal, amplified and used to calculate SE. The calculated SE is then used to determine how to adjust the modulation current amplitude. This method can be used while transmitting actual data, but requires that high accuracy circuits such as amplifiers, analog-to-digital converters (ADCs) and digital-to-analog converters (DACs) be included in the feedback path. In addition, this technique also requires a significant amount of signal processing, and is therefore computationally intensive.

A need exists for a way to determine the adjustment needed, if any, to the amplitude of the modulation current in order to achieve a desired or required output power level, which can be used when transmitting actual data, which uses the existing feedback path, which does not require complex high-accuracy circuitry, and which does not require that over-temperature testing be performed.

SUMMARY OF THE INVENTION

The invention provides a method and an apparatus for controlling modulation of a laser. The apparatus comprises a laser capable of being driven to produce light, a laser driver that generates an electrical bias current signal and an electrical modulation current signal that are used to drive the laser to cause the laser to produce light, a laser output power monitoring device that receives a fraction of the light produced by the laser as optical feedback and generates an electrical feedback signal based on the fraction of the light received from the laser, and a laser controller that controls the laser driver. The laser controller is configured to receive the electrical feedback signal and to perform a control algorithm that obtains a measurement of the average output power level of the laser based on the electrical feedback signal and produces a bias current control signal and a modulation current control signal based on the measured average laser output power level. The bias current and modulation current control signals are received by the laser driver, which uses them to set an amplitude for the electrical current bias signal and an amplitude for the electrical modulation current signal, respectively.

The method of the invention comprises:
  monitoring optical feedback from a laser to obtain a measurement of an average output power level of the laser, determining whether the measured average output power level of the laser is above or below a target average output power level, if a determination is made that the measured average output power level is above or below the target average output power level, adjusting the amplitude of an electrical bias current being delivered to the laser until the measured average output power level of the laser is at least substantially equal to the target average output power level, determining whether the laser is being over-modulated or under-modulated, and, if a determination is made that the laser is being over-modulated or under-modulated, adjusting the amplitude of an electrical modulation current being delivered to the laser to reduce or eliminate over-modulation or under-modulation of the laser.

These and other features and advantages of the invention will become apparent from the following description, drawings and claims.

DETAILED DESCRIPTION OF AN ILLUSTRATIVE EMBODIMENT

Figure 1:
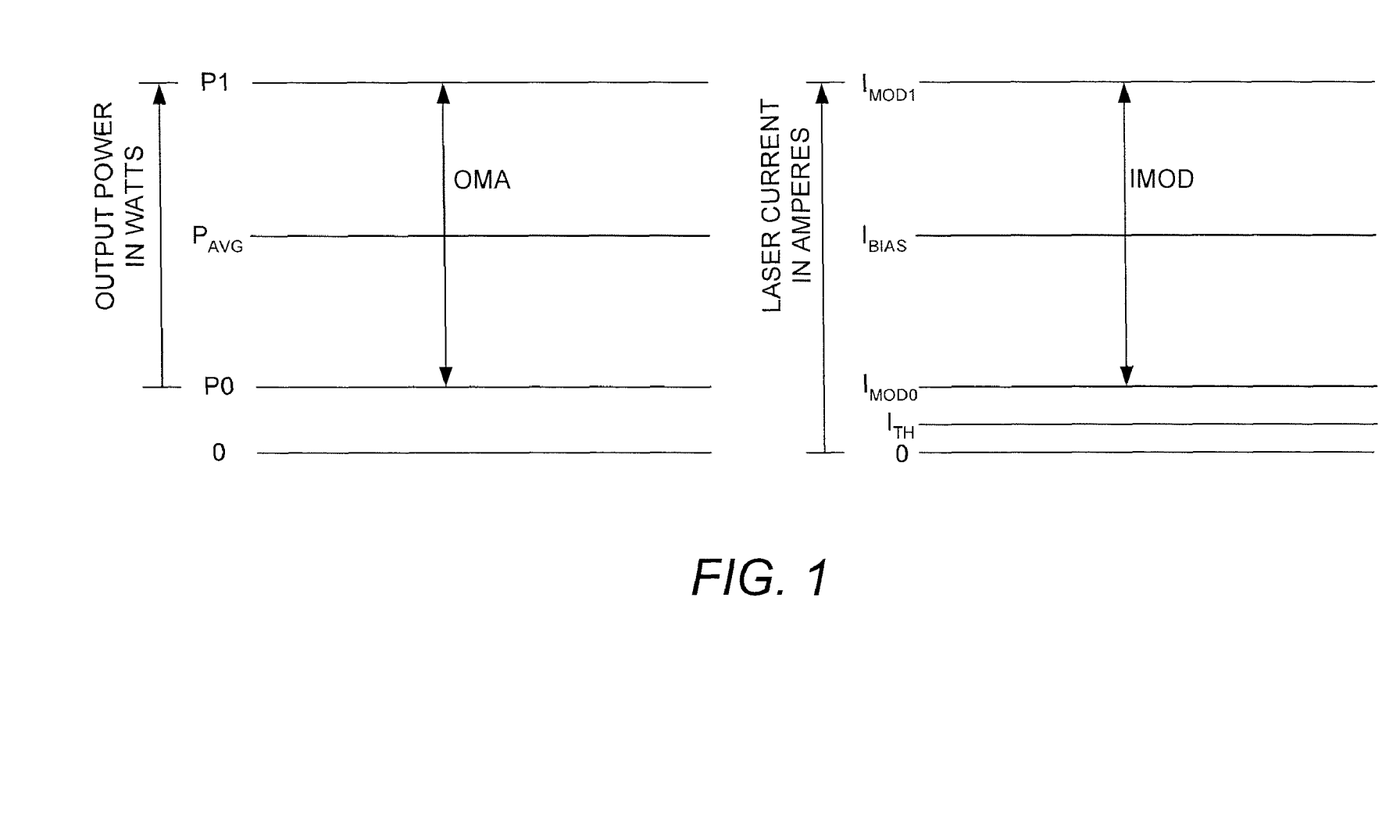
FIG. 1 is a graph illustrating the relationship between laser output power in watts and laser bias, threshold and modulation current in amperes.

FIG. 1 is a graph illustrating the relationship between laser output power in watts and laser current (bias, threshold and modulation) in amperes. In accordance with the invention, it has been determined that optimum laser performance is obtainable by modulating the laser with a modulation current for a logic 0 level, $I_{MOD0}$, that has an amplitude that is equal to or slightly greater than the amplitude of the laser threshold current, $I_{TH}$. The modulation current for logic 0 level corresponds to an output power level of P0. When the amplitude of $I_{MOD0}$ falls below the amplitude of $I_{TH}$, the laser is being over-modulated due to the fact that the laser is being turned off and the level of P0 cannot fall below zero, so the amplitude of the modulation current for a logic 1 level, $I_{MOD1}$, must be increased in order to maintain $I_{BIAS}$ at a constant amplitude. Maintaining $I_{BIAS}$ at a constant amplitude generally results in $P_{AVG}$ being maintained at a constant level, except when the laser is being over-modulated. When the amplitude of $I_{MOD0}$ falls below the amplitude of $I_{TH}$, the laser turns completely off during the transmission of a logic 0 (output power level P0). When the laser turns off during the transmission of a logic 0, this slows down the transition back to a logic 1 (output power level P1), which degrades laser performance. When the amplitude of $I_{MOD0}$ exceeds the amplitude of $I_{TH}$ by too much, the amplitude of $I_{MOD1}$ must be decreased to maintain $I_{BIAS}$ at a constant amplitude. In this case, the laser is being under-modulated. In accordance with the invention, the amplitude of $I_{MOD}$ and/or the amplitude of $I_{BIAS}$ are adjusted based on the measured average output power level $P_{AVG}$ to obtain a desired or optimum modulation current $I_{MOD}$.

The laser modulation current, $I_{MOD}$, has an amplitude that is equal to the amplitude of $I_{MOD1}$ minus the amplitude of $I_{MOD0}$. The laser bias current $I_{BIAS}$ has an amplitude necessary to keep the average power level at its desired average value. As is shown in FIG. 1, the amplitudes of $I_{BIAS}$, $I_{MOD0}$ and $I_{MOD1}$ correspond to the output power levels of $P_{AVG}$, P0 and P1, respectively. The difference between the P1 and P0 levels is the optical modulation amplitude (OMA) of the laser. The average output power level $P_{AVG}$ is the average OMA (i.e., the sum of P0 and P1 levels divided by two). The average output power level of the laser is measured through optical feedback and a running average over time is maintained. Although $P_{AVG}$ generally is controlled by setting the amplitude of the bias current $I_{BIAS}$, changes in the amplitude of $I_{MOD}$ result in changes to the OMA, and thus result in changes to the $P_{AVG}$ level in some conditions. Therefore, in accordance with the invention, both or either of the amplitudes of $I_{BIAS}$ and $I_{MOD}$ are adjusted as needed based on the measured $P_{AVG}$ level to maintain $P_{AVG}$ at a reasonably constant level while also achieving a desired or optimum amplitude for $I_{MOD}$, as will now be described with reference to FIGS. 2-4C.

Figure 2:
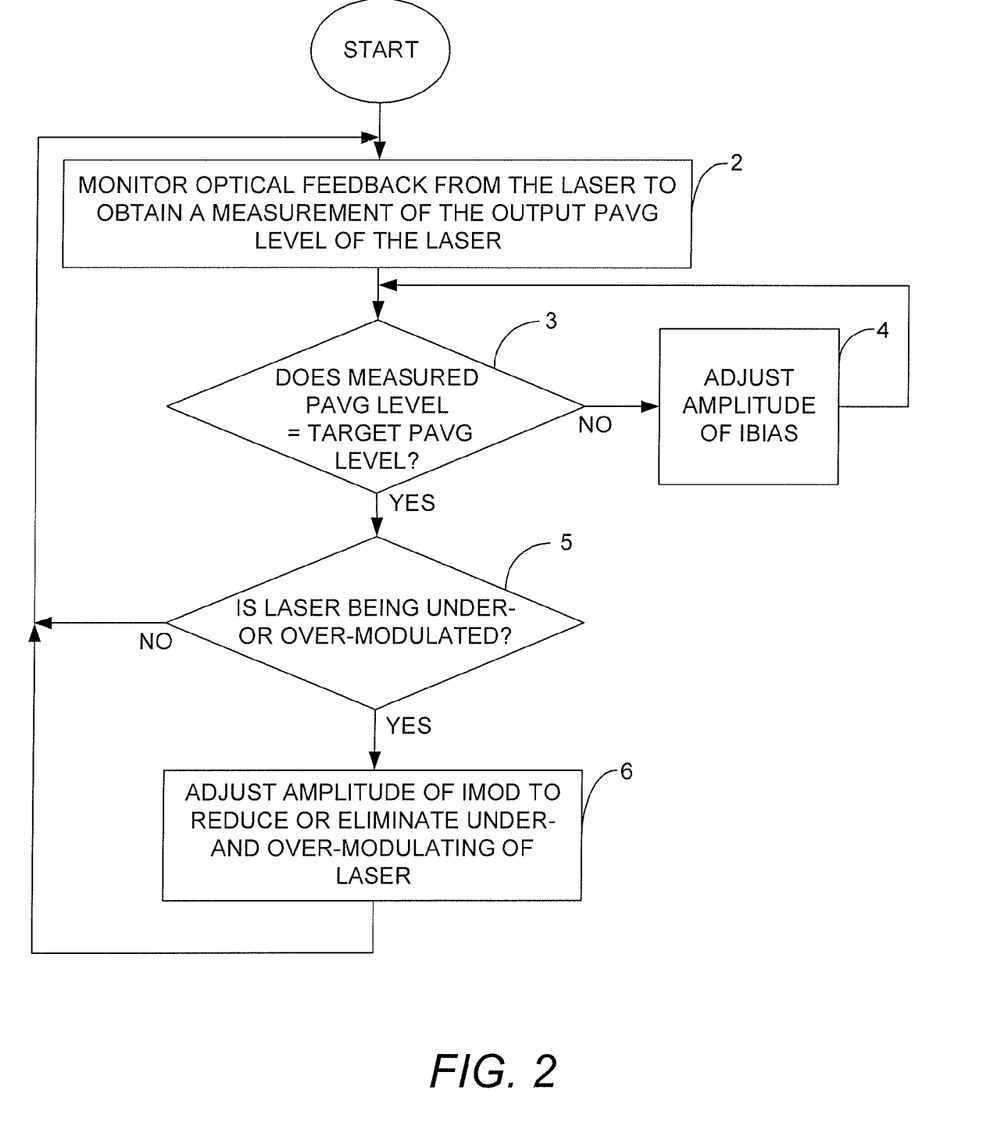
FIG. 2 illustrates a flowchart that demonstrates the method of the invention in accordance with an illustrative embodiment for controlling laser modulation based on the output power level of the laser.

FIG. 2 illustrates a flowchart that demonstrates the method of the invention in accordance with an illustrative embodiment. Optical feedback from the laser is monitored to obtain a measurement of an average output power level of the laser $P_{AVG}$, as indicated by block 2. As the measurements of the $P_{AVG}$ level are obtained, a determination is made as to whether the measured $P_{AVG}$ level is equal to, or at least substantially equal to the target $P_{AVG}$ level for the laser, as indicated by block 3. If not, the amplitude of $I_{BIAS}$ is adjusted, as indicated by block 4. The process returns to block 3 and the amplitude of $I_{BIAS}$ continues to be adjusted until the measured $P_{AVG}$ level is equal to the target $P_{AVG}$ level. Once the target $P_{AVG}$ level has been obtained, a determination is made, based on the measured $P_{AVG}$ level, as to whether the laser is being over- or under-modulated, as indicated by block 5. If it is determined that the laser is being over- or under-modulated, then the amplitude of $I_{MOD}$ and is adjusted to eliminate or at least substantially reduce any over- or under-modulation, as indicated by block 6. This latter step achieves a desired or optimum amplitude for $I_{MOD}$. The process then returns to block 2 so that the laser output power level continues to be monitored and adjustments continue to be made to the amplitudes of $I_{BIAS}$ and/or $I_{MOD}$ to achieve the target $P_{AVG}$ level and the optimum or desired $I_{MOD}$ amplitude. The manner in which the amplitude of $I_{MOD}$ is adjusted varies depending on whether the laser is being under- or over-modulated, as will be described in more detail below with respect to the illustrative embodiment of FIGS. 4A-4C.

Figure 3:
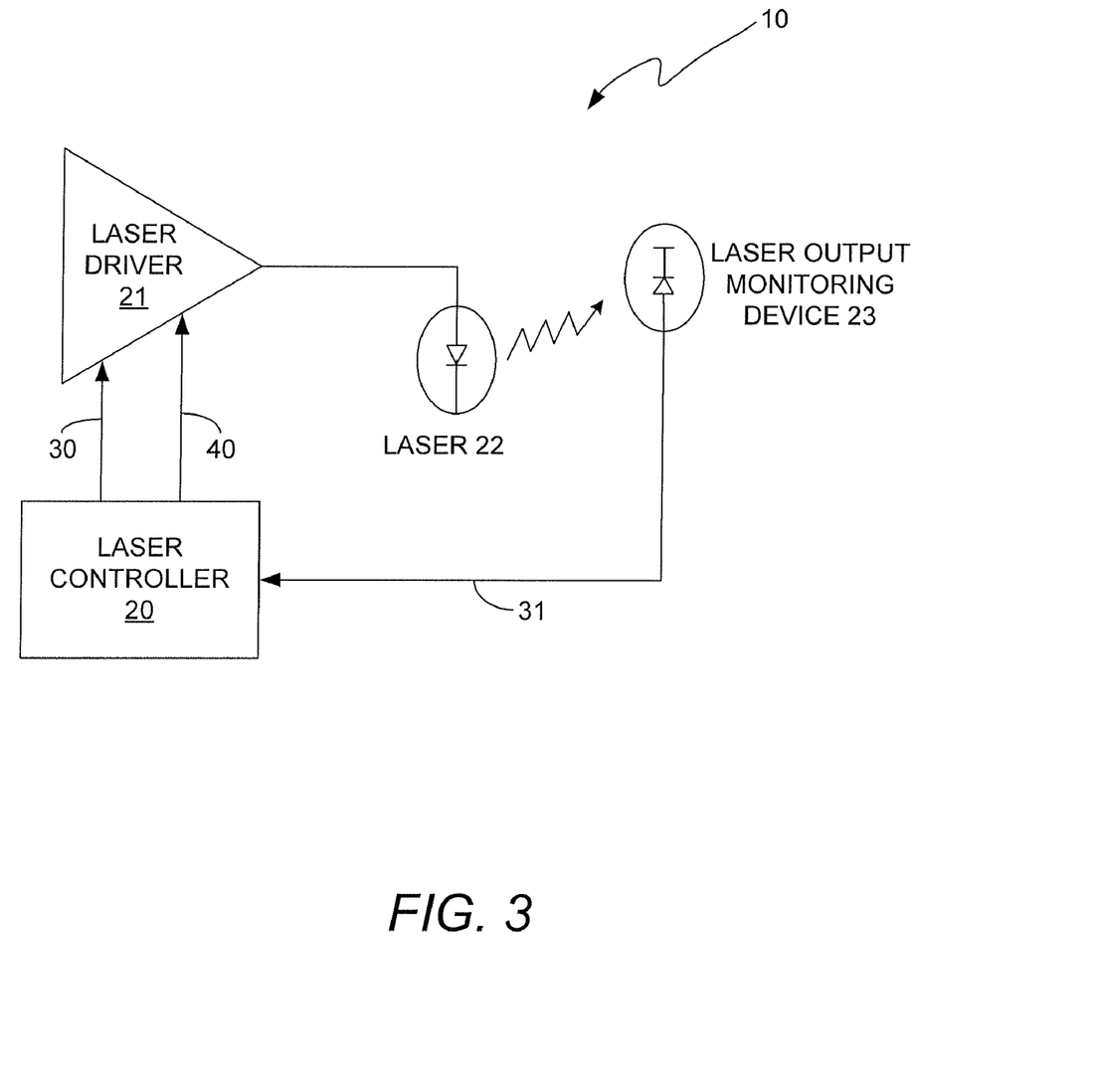
FIG. 3 illustrates a block diagram of the apparatus of the invention in accordance with an illustrative embodiment in which the invention is employed in an optical communications network of some type for transmitting and/or receiving amplitude modulated optical signals.

FIG. 3 illustrates a block diagram of the apparatus 10 of the invention in accordance with an illustrative embodiment in which the invention is employed in an optical communications network of some type for transmitting and/or receiving amplitude modulated optical signals. The apparatus 10 includes a laser controller 20, a laser driver 21, a laser 22, and a laser output power monitoring device 23. The laser controller 20 and the laser driver 21 are typically separate integrated circuit (ICs) that are mounted to a transceiver housing (not shown) of an optical communications transceiver (not shown) and electrically connected with one another. The laser 22 is typically a laser diode, but may be any type of laser that is directly modulated. The laser output power monitoring device 23 is typically a photodiode, but may be any type of device capable of monitoring the optical output power of the laser 22.

During operations, the laser controller 20 outputs a bias current control signal 30 and a modulation current control signal 40 to the laser driver 21. The laser driver 21 receives the control signals 30 and 40 and sets the amplitude of the bias current $I_{BIAS}$ and the amplitude of the modulation current $I_{MOD}$ in accordance with the respective control signals. As the laser 22 is modulated by the laser driver 21, the monitoring device 23 converts the optical feedback from the laser 22 into an electrical feedback signal 31, which is fed back to the laser controller 20. The laser controller 20 processes the feedback signal 31 in accordance with the algorithm of the invention described above with reference to FIG. 2 to generate the control signals 30 and 40. An ADC (not shown) converts the electrical analog signal 31 into an electrical digital signal that is suitable for processing by the laser controller 20. The ADC may be integrated as part of the monitoring device 23, as part of the laser controller 20, or it may be a separate device that is interposed between the laser controller 20 and the monitoring device 23. Typically, a DAC (not shown) is interposed between the output of the laser driver 21 and the input of the laser 22 to convert the digital $I_{BIAS}$ and $I_{MOD}$ signals output from the laser driver 21 into an analog modulation signal for modulating the laser 22. The modulation current $I_{MOD}$ is superimposed onto the bias current $I_{BIAS}$ to modulate the laser 22.

Figure 4A:
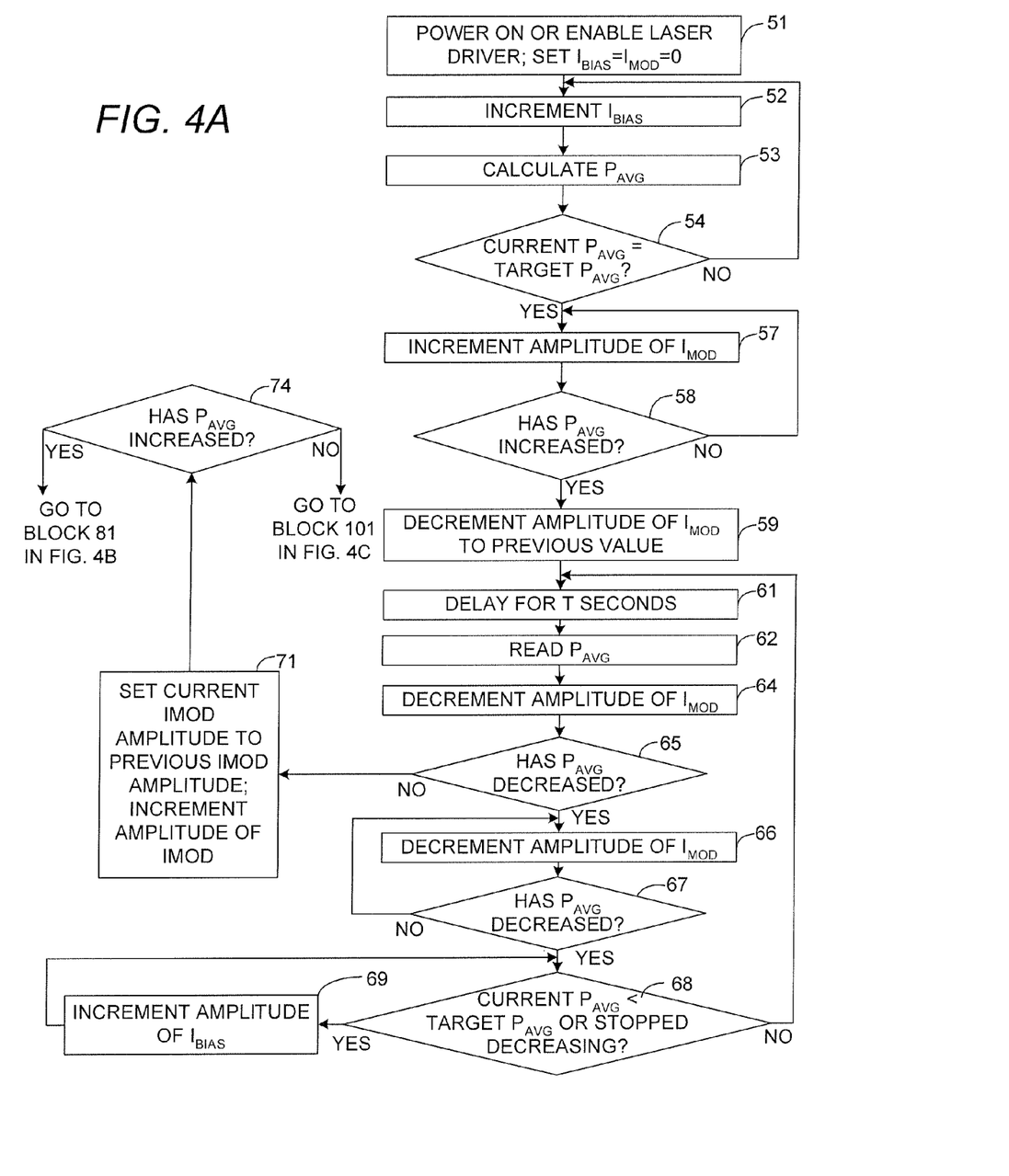
FIGS. 4A-4C illustrate flowcharts that represent the method of the invention in accordance with one exemplary embodiment performed by the laser controller shown in FIG. 3 for adjusting amplitudes of $I_{MOD}$ and/or $I_{BIAS}$ based on the monitored output power level of the laser shown in FIG. 3.
Figure 4B:
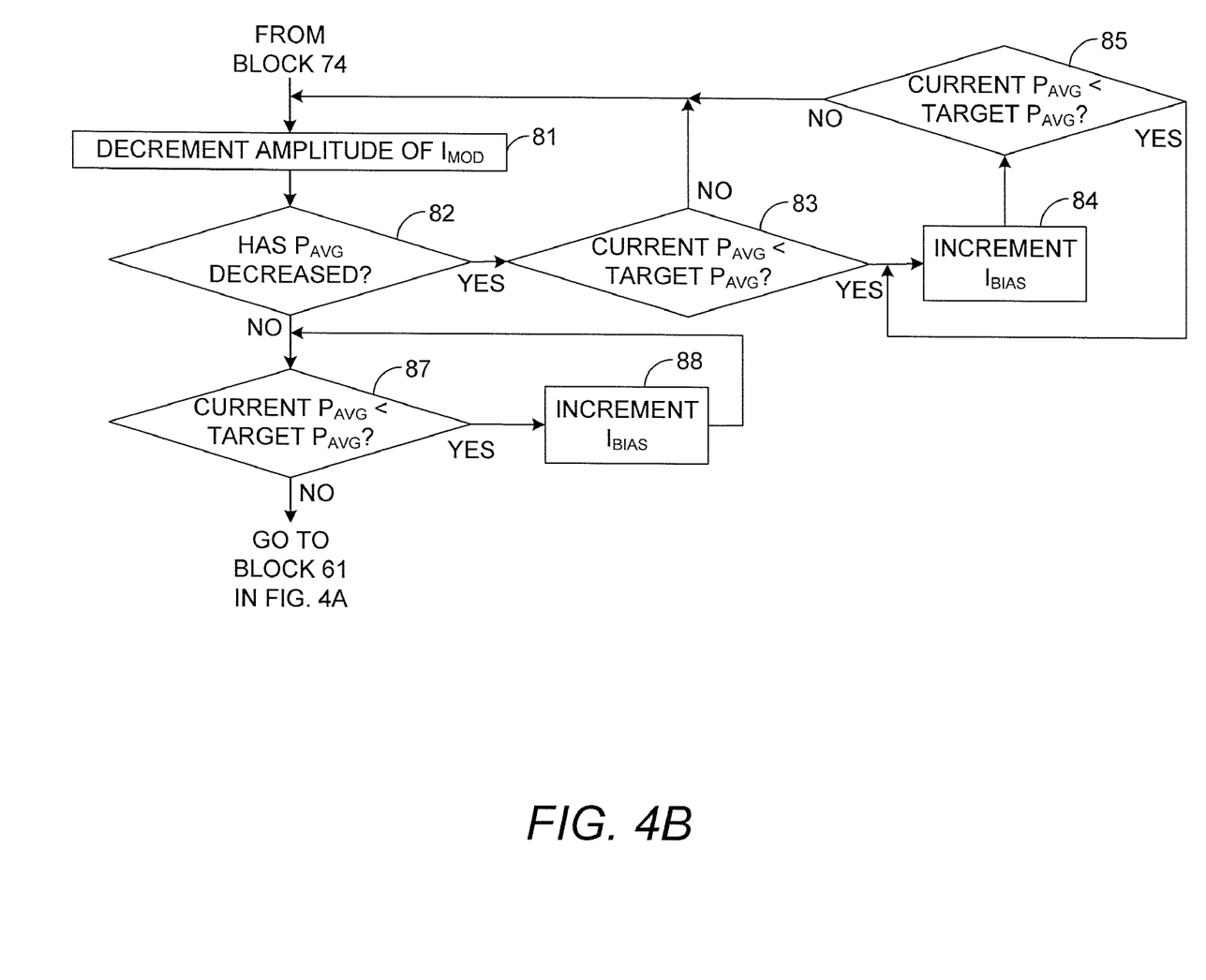
Figure 4C:
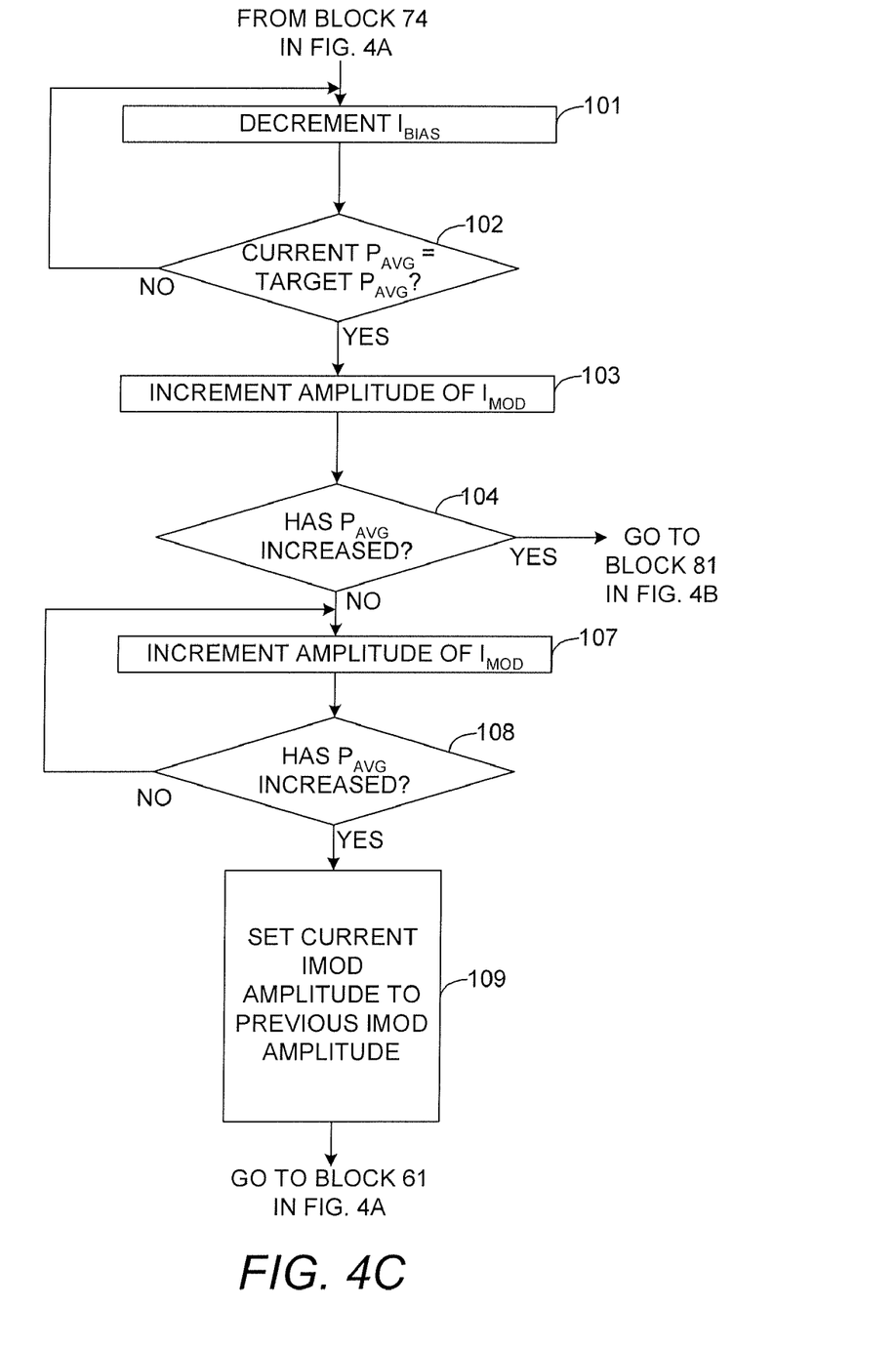

FIGS. 4A-4C illustrate flowcharts that represent the method of the invention in accordance with one exemplary embodiment for adjusting $I_{MOD}$ and/or $I_{BIAS}$ based on the average of the monitored output power level of the laser 22. As described above, the feedback path comprising the monitoring device 23 and the ADC (not shown) is currently used in existing communications transmitters to control the average output power level. In accordance with the invention, this existing path is used in combination with processing logic of the laser controller 20 to control both the average output power level $P_{AVG}$ and the amplitude of the modulation current $I_{MOD}$. While the invention is not limited to the embodiment described below with reference to FIGS. 4A-4C, this embodiment provides an example of one way to accomplish the objectives of controlling $P_{AVG}$ and $I_{MOD}$ based solely on the electrical feedback signal 31.

On power up, the existing feedback path is used to adjust $P_{AVG}$ to obtain a pre-programmed $P_{AVG}$ target level. Blocks 51-54 represent the process of adjusting $P_{AVG}$ until the target level is obtained. At block 51, the power to the laser driver is turned on or enabled and the amplitudes of $I_{BIAS}$ and $I_{MOD}$ are set equal to zero. The amplitude of $I_{BIAS}$ is then increased incrementally while the laser controller receives the monitored output power level and measures the average power level, as indicated by bocks 52 and 53. While the tasks represented by blocks 52 and 53 are being performed, a determination is made by the controller as to whether the target $P_{AVG}$ level has been reached, as indicated by block 54. If not, the process returns to block 52 and continues until the target $P_{AVG}$ level has been reached. Once a determination is made at block 54 that the target $P_{AVG}$ level has been reached, the process proceeds to block 57.

At blocks 57 and 58, the amplitude of $I_{MOD}$ is incrementally increased while a determination is made as to whether the monitored $P_{AVG}$ level has increased. The amplitude of $I_{MOD}$ continues being incrementally increased until a determination is made at block 58 that an increase in the $P_{AVG}$ level has been detected. When an increase in the $P_{AVG}$ level is detected, the amplitude of $I_{MOD}$ is set to the previous value (i.e., the value prior to being incremented to the value that resulted in the increase in the $P_{AVG}$ level being detected), as indicated by block 59. It is not a requirement that the immediately preceding value be used. Which of the previous values is chosen depends on the measurement and control resolution of the system.

At this point in the process, the amplitudes of $I_{BIAS}$ and $I_{MOD}$ are now at initial values that can be used to transmit actual data. When any adjustments to the amplitude of $I_{MOD}$ are made prior to its initial value being obtained at block 59, the $I_{BIAS}$ adjustments within the laser driver are stopped so that the laser bias current stays fixed. Once the amplitude of $I_{MOD}$ has been set to its initial value, the transmitter is ready to send actual data. Therefore, the $I_{BIAS}$ control loop is then enabled (not shown) while $P_{AVG}$ continues to be monitored for changes and necessary adjustments are made to the amplitudes of $I_{MOD}$ and/or $I_{BIAS}$. Periodically (every T seconds), a power maintenance algorithm is launched (as described in the following test) to make sure the power levels are maintained as desired, as indicated by block 61.

First, during the power maintenance algorithm, $P_{AVG}$ is read and the amplitude of $I_{MOD}$ is decremented, as indicated by blocks 62 and 64. A determination is made as to whether or not the current $P_{AVG}$ level has decreased below the previous $P_{AVG}$ level, as indicated by block 65. Each time the laser controller computes the $P_{AVG}$ level, the controller stores the $P_{AVG}$ level as the current $P_{AVG}$ level in memory in the controller. One or more previous $P_{AVG}$ levels are also stored so that the controller can determine whether an increase or decrease in the amplitude of $I_{MOD}$ resulted in an increase or a decrease in the $P_{AVG}$ level. If a decrease in $P_{AVG}$ is detected at block 65, the amplitude of $I_{MOD}$ is incrementally decreased until a determination is made that the current $P_{AVG}$ level has decreased, as indicated by blocks 66 and 67. A determination is then made as to whether the current $P_{AVG}$ level is below the target $P_{AVG}$ level or has stopped decreasing, as indicated by block 68. If the current Pavg falls below the target $P_{AVG}$ then the amplitude of $I_{BIAS}$ is increased to maintain the average power level at its target, as indicated by block 69. Once the controller detects no more decreases in the $P_{AVG}$ level, the process returns to block 61 at which the controller starts the power maintenance algorithm again.

If it is determined at block 65 that the $P_{AVG}$ level has not changed, then at block 71 the amplitude of $I_{MOD}$ is incremented to the previous value plus one increment, i.e., the value obtained at block 59 plus one increment. A determination is then made at block 74 as to whether the current $P_{AVG}$ level is greater than the previous $P_{AVG}$ level (the $P_{AVG}$ level prior to incrementing at block 71). If so, then the laser is being over-modulated. To correct for over-modulation, the process proceeds to block 81 in FIG. 4B. If a determination is then made at block 74 that the current $P_{AVG}$ level is not greater than the previous $P_{AVG}$ level, it is possible that the laser is being under-modulated. To correct for under-modulation, the process proceeds to block 101 in FIG. 4C.

With reference to FIG. 4B, the amplitude of $I_{MOD}$ is decremented at block 81. A determination is then made at block 82 as to whether the current $P_{AVG}$ level is less than the previous $P_{AVG}$ level (i.e., the level prior to decrementing at block 81). If so, the controller will continue decreasing the amplitude of $I_{MOD}$ until either the $P_{AVG}$ level stops decreasing or until the controller determines that the $P_{AVG}$ level has dropped below the target $P_{AVG}$ level. Therefore, if a decrease in the $P_{AVG}$ level is detected, a determination is made as to whether the $P_{AVG}$ level is below the target $P_{AVG}$ level, as indicated by block 83. If not, the process returns to block 81. If so, the amplitude of $I_{BIAS}$ is incrementally increased, as indicated by block 84. A determination is then made as to whether the $P_{AVG}$ level is below the target $P_{AVG}$ level, as indicated by block 85. If so, the process returns to block 84. If not, the process returns to block 81.

If a determination is made at block 82 that the $P_{AVG}$ level is no longer decreasing, a determination is made as to whether the $P_{AVG}$ level is below the target $P_{AVG}$ level, as indicated by block 87. If not, the process returns to block 61 in FIG. 4A, and the power maintenance algorithm will again be performed after a delay of T seconds has lapsed. If so, the amplitude of $I_{BIAS}$ is incrementally increased until the $P_{AVG}$ level is no longer below the $P_{AVG}$ target level, as indicated by block 88. The amplitude of $I_{MOD}$ is now at the desired or optimum level and the laser is not being over-modulated.

With reference to FIG. 4C, the amplitude of $I_{BIAS}$ is incrementally decreased until the current $P_{AVG}$ level is no longer above the target $P_{AVG}$ level, as indicated by blocks 101 and 102. The amplitude of $I_{MOD}$ is then incrementally increased at block 103 and a determination is made at block 104 as to whether the current $P_{AVG}$ level is greater than the previous $P_{AVG}$ level (the level prior to incrementing the amplitude of $I_{MOD}$ at block 103). If so, then it is possible that the laser is being over-modulated, and the process therefore proceeds to block 81 in FIG. 4B. If no increase in the $P_{AVG}$ level is detected, the process proceeds to block 107, at which the amplitude of $I_{MOD}$ is incrementally increased. A determination is then made at block 108 as to whether the current $P_{AVG}$ level (the level obtained after incrementing the amplitude of $I_{MOD}$ at block 107) is greater than the previous $P_{AVG}$ level (the level obtained prior to incrementing the amplitude of $I_{MOD}$ at block 107). If not, the controller continues to increment the amplitude of $I_{MOD}$ until it detects an increase in the $P_{AVG}$ level. Once an increase in the $P_{AVG}$ level has been detected, the amplitude of $I_{MOD}$ is set to the previous value (i.e., the value prior to the most recent value obtained at block 107), as indicated by block 109. The process then returns to block 61 in FIG. 4A. The amplitude of $I_{MOD}$ is now at the desired or optimum level and the laser is not being under-modulated.

It should be noted that because changes in laser threshold current $I_{TH}$ and slope efficiency SE happen at a very slow rate compared to the speed of the controller, the number of alternate iterations between adjusting the amplitude of $I_{BIAS}$ and adjusting the amplitude of $I_{MOD}$ will be very small, and thus the affect of these adjustments on the transmitted data will not be noticeable. To cover the possibility of simultaneous changes in SE and $I_{TH}$ that might not produce a change in $P_{AVG}$ but might produce an increase the ER/OMA, a test should be performed periodically to determine whether the laser is being under- or over-modulated. For this test, the controller will make small changes in the amplitude of $I_{MOD}$ and check for the conditions of under-modulation and over-modulation. An incremental decrease in the amplitude of $I_{MOD}$ that results in no change in the $P_{AVG}$ level followed by an incremental increase in the amplitude of $I_{MOD}$ that results in an increase in $P_{AVG}$ indicates that the desired or optimum operating condition has been achieved. This indicates that the amplitude of $I_{MOD0}$ is at or just above the amplitude of $I_{TH}$. An incremental decrease in the amplitude of $I_{MOD}$ that results in a decrease in the $P_{AVG}$ level indicates over-modulation (the amplitude of $I_{MOD0}$ is too far below the amplitude of $I_{TH}$), and can be handled by performing the process described above with reference to FIG. 4B. An incremental increase in the amplitude of $I_{MOD}$ that results in no change to the $P_{AVG}$ level indicates under-modulation (the amplitude of $I_{MOD0}$ is above the amplitude of $I_{TH}$), and can be handled by performing the steps described above with reference to FIG. 4C.

The laser controller 20 may be any type of computational device capable of performing the processing tasks described above to generate the control signals 30 and 40. For example, the controller may be a microprocessor, a microcontroller an application specific integrated circuit (ASIC), a programmable logic array (PLA), a programmable gate array (PGA), etc. The algorithms of the invention may be performed in hardware, software, firmware, or a combination thereof. If part or all of the algorithms are performed in software or firmware, the corresponding computer code will typically be stored in one or more computer-readable medium devices, which may be integrated together with the laser controller in a single IC or which may be implemented in a separate IC. The computer-readable medium need not be a solid state memory device, but may be any type of memory element that is suitable for the purpose for which it is used. Suitable memory devices include random access memory (RAM), read-only memory (ROM), programmable read-only memory (PROM), erasable PROM (EPROM), magnetic disks, magnetic tape, flash memory, etc. If all or part of the algorithms are performed in hardware in the controller, the hardware may be implemented in the form of one or more state machines, for example.

It should be noted that the invention has been described with reference to a few illustrative embodiments for the purposes of demonstrating the principles and concepts of the invention and to provide a few examples of the manner in which the invention may be implemented. The invention is not limited to these embodiments, as will be understood by persons skilled in the art in view of the description provided herein. The invention also is not limited to being used in a communications transmitter, but may be used in any type of application including, for example, medical, industrial, printing, and defense applications. Those skilled in the art will understand that modifications may be made to the embodiments described herein and that all such modifications are within the scope of the invention.

What is claimed is:

1. An apparatus for controlling modulation of a laser, the apparatus comprising:
    a laser capable of being driven to produce light;
    a laser driver that generates an electrical bias current signal and an electrical modulation current signal that are used to drive the laser to cause the laser to produce light;
    a laser output power monitoring device that receives a fraction of the light produced by the laser as optical feedback and generates an electrical feedback signal based on the fraction of the light received from the laser;
    a laser controller comprising an integrated circuit configured to receive the electrical feedback signal and to perform a control algorithm that obtains a measurement of an average output power level of the laser based on the electrical feedback signal and produces a bias current control signal and a modulation current control signal based on the measured average output power level of the laser, the bias current and modulation current control signals being received by the laser driver, and wherein the laser driver uses the bias current control signal and the modulation current control signal to set an amplitude for the electrical current bias signal and an amplitude for the electrical modulation current signal, respectively, wherein when the laser controller performs said at least one control algorithm, the laser controller detects whether the laser is being over-modulated or under-modulated based on the measured average laser output power level, wherein if the laser controller detects that the laser is being over-modulated or under-modulated, the modulation current control signal produced by the laser controller and received by the laser driver causes the laser driver to adjust the amplitude of the electrical modulation current signal to reduce or eliminate the over-modulation or under-modulation of the laser; wherein when the laser controller detects the laser is being over-modulated by determining if the average laser output power level has increased, the laser controller initially causes the modulation current control signal to decrease the amplitude of the modulation current while maintaining the amplitude of the bias current; and when the laser controller detects that the laser is being under-modulated by determining if the average laser output power level has decreased, the laser controller initially causes the bias current control signal to decrease the amplitude of the bias current while maintaining the amplitude of the modulation current.

2. The apparatus of claim 1, wherein when the laser controller performs said at least one control algorithm, the laser controller also detects whether the measured average laser output power level is above or below a target average laser output power level, wherein if the laser controller detects that the measured average laser output power is above or below the target average laser output power level, the bias current control signal produced by the laser controller and received by the laser driver causes the laser driver to adjust the amplitude of the electrical bias current signal until the measured average laser output power level is at least substantially equal to the target average laser output power level.

3. The apparatus of claim 1, wherein the laser is a laser diode and wherein the laser output power monitoring device is a photodiode.

4. The apparatus of claim 3, wherein the modulation current control signal produced by the laser controller based on the measured average laser output power level ensures that the electrical modulation current signal used to cause the laser to produce a logic 0 output power level has an amplitude that is set equal to or slightly greater than a threshold current amplitude needed to cause the laser to produce laser action.

5. The apparatus of claim 1, wherein if the laser driver is caused to decrease the amplitude of the electrical modulation current signal, the laser controller determines whether the measured average laser output power level is equal to a target average laser output power level, wherein if a determination is made that the measured average laser output power level is not equal to the target average laser output power level, the bias current control signal produced by the laser controller causes the laser driver to increase the amplitude of the electrical bias current signal until the laser controller determines that the measured average laser output power level is equal to the target average laser output power level.

6. The apparatus of claim 1, wherein if the laser driver is caused to increase the amplitude of the electrical modulation current signal, the laser controller determines whether the measured average laser output power level is equal to a target average laser output power level, wherein if a determination is made that the measured average laser output power level is not equal to the target average laser output power level, the bias current control signal produced by the laser controller causes the laser driver to decrease the amplitude of the electrical bias current signal until the laser controller determines that the measured average laser output power level is equal to the target average laser output power level.

7. A method for controlling modulation of a laser comprising:
    monitoring optical feedback from a laser to obtain a measurement of an average output power level of the laser;
    determining whether the measured average output power level of the laser is above or below a target average output power level;
    if a determination is made that the measured average output power level is above or below the target average output power level, adjusting an amplitude of an electrical bias current being delivered to the laser until the measured average output power level of the laser is at least substantially equal to the target average output power level;
    determining whether the laser is being over-modulated or under-modulated;
    if a determination is made that the laser is being over-modulated or under-modulated, adjusting the amplitude of an electrical modulation current being delivered to the laser to reduce or eliminate over-modulation or under-modulation of the laser;
    if a determination is made that the laser is being over-modulated by sensing if the average laser output power level has increased, decreasing the amplitude of the modulation current while maintaining the amplitude of the bias current; and
    if a determination is made that the laser is being under-modulated by sensing if the average laser output power level has decreased, decreasing the amplitude of the bias current while maintaining the amplitude of the modulation current.

8. The method of claim 7, further comprising: if an adjustment was made to the amplitude of the electrical modulation current, determining whether the measured average output power level of the laser is equal to a target average output power level, wherein if a determination is made that the measured average output power level of the laser is not equal to a target average output power level, adjusting the amplitude of the electrical bias current until a determination is made that the measured average output power level of the laser is equal to or substantially, equal to the target average output power level.

9. The method of claim 7, wherein determining whether the laser is being over modulated comprises: determining whether the measured average output power level of the laser has increased; if a determination is made that the measured average output power level of the laser has increased, incrementally increasing the amplitude of the electrical modulation current; and determining whether an increase in the measured average output power level of the laser has been detected subsequent to the incremental increase in the amplitude of the electrical modulation current, wherein if an increase in the measured average output power level of the laser is detected, the laser is being over-modulated.

10. The method of claim 9, further comprising: if a determination is made that the laser is being over-modulated, decrementally decreasing the amplitude of the electrical modulation current; determining whether the measured average output power level of the laser has decreased; if it is determined that the measured average output power level of the laser has not decreased, decrementally decreasing the amplitude of the electrical modulation current; and
determining whether the measured average output power level of the laser has fallen below the target average output power level.

11. The method of claim 10, further comprising: if it is determined that the measured average output power level of the laser has fallen below the target output power level, incrementally increasing the electrical bias current until it is determined that the measured average output power level of the laser is above the target average output power level; decrementally decreasing the amplitude of the electrical modulation current until it is determined that the measured average output power level of the laser has decreased; determining whether the measured average output power level of the laser has fallen below the target average output power level; and if it is determined that the measured average output power level of the laser has fallen below the target average output power level, incrementally increasing the electrical bias current until the measured average output power level is no longer below the target average output power level.

12. The method of claim 7, wherein determining whether the laser is being undermodulated comprises: determining whether the measured average output power level of the laser has increased; if a determination is made that the measured average output power level of the laser has not increased, decrementally decreasing the amplitude of the electrical bias current until it is determined that the measured average output power level of the laser is equal to the target average output power level; incrementally increasing the amplitude of the electrical modulation current; determining whether an increase in the measured average output power level of the laser has been detected subsequent to the incremental increase in the amplitude of the electrical modulation current, wherein if an increase in the measured average output power level of the laser has not been detected, then the laser is being under-modulated.

13. The method of claim 12, further comprising: if the laser is being under-modulated, continuing to incrementally increase the amplitude of the electrical modulation current until a determination is made that the measured average output power level has increased.

14. The method of claim 13, further comprising: determining whether the measured average output power level of the laser is equal to the target average output power level; and if it is determined that the measured average output power level of the laser is not equal to the target average output power level, incrementally increasing or decreasing the electrical bias current until the measured average output power level is equal to or at least substantially equal to the target average output power level.

15. A computer program for controlling modulation of a laser, the computer program comprising instructions stored on a computer-readable medium, the instructions comprising:
instructions for obtaining a measurement of an average output power level of a laser based on monitored optical feedback from the laser;
instructions for determining whether the measured average output power level of the laser is above or below a target average output power level;
instructions for generating a control signal that causes an amplitude of an electrical bias current being delivered to the laser to be adjusted if it is determined that the measured average output power level is above or below the target average output power level, the amplitude of the electrical modulation current being adjusted until the measured average output power level of the laser is at least substantially equal to the target average output power level;
instructions for determining whether the laser is being over-modulated or undermodulated; and
instructions for generating a control signal that causes the amplitude of an electrical modulation current being delivered to the laser to be adjusted if it is determined that the laser is being over-modulated or under-modulated, wherein the instructions for determining whether the laser is being over-modulated or undermodulated comprise: instructions for generating a control signal that causes the amplitude of the electrical modulation current being delivered to the laser to be decreased while maintaining the amplitude of the bias current if it is determined that the laser is being over-modulated by sensing if the average laser output power level has increased; the instructions for determining whether the laser is being undermodulated generating a control signal that causes the amplitude of the electrical bias current being delivered to the laser to be decreased while maintaining the amplitude of the modulation current if it is determined that the laser is being undermodulated by sensing if the average laser output power level has decreased.

16. The computer program of claim 15, wherein the instructions for determining whether the laser is being over-modulated include: instructions for determining whether the measured average output power level of the laser has increased, wherein if it is determined that the measured average output power level of the laser has increased, the instructions that generate the control signal cause the amplitude of the electrical modulation current to be incrementally increased; and instructions for determining whether an increase in the measured average output power level of the laser has been detected subsequent to the incremental increase in the amplitude of the electrical modulation current, wherein if an increase in the measured average output power level of the laser is detected, the laser is being over-modulated.

17. The computer program of claim 15, wherein the instructions for determining whether the laser is being under-modulated include: instructions for determining if the measured average output power level of the laser has not increased, then the instructions that generate the control signal cause the amplitude of the electrical bias current to be incrementally decreased until it is determined that the measured average output power level of the laser is equal to the target average output power level; instructions for incrementally increasing the amplitude of the electrical modulation current; instructions for determining whether an increase in the measured average output power level of the laser has been detected subsequent to the incremental increase in the amplitude of the electrical modulation current, wherein if an increase in the measured average output power level of the laser has not been detected, then the laser is being under-modulated.

* * * * *